(12) United States Patent
Yeo et al.

(10) Patent No.: US 7,273,822 B2
(45) Date of Patent: Sep. 25, 2007

(54) METHODS AND APPARATUS FOR FORMING THIN FILMS FOR SEMICONDUCTOR DEVICES

(75) Inventors: Jae-Hyun Yeo, Bucheun-si (KR); Young-Wook Park, Suwon-si (KR); Ki-Chul Kim, Sungnam-si (KR); Jae-Jong Han, Seoul (KR)

(73) Assignee: Samsung Electronics Co., Ltd. (KR)

( * ) Notice: Subject to any disclaimer, the term of this patent is extended or adjusted under 35 U.S.C. 154(b) by 118 days.

(21) Appl. No.: 11/038,324

(22) Filed: Jan. 19, 2005

(65) Prior Publication Data
US 2005/0158977 A1 Jul. 21, 2005

(30) Foreign Application Priority Data
Jan. 20, 2004 (KR) .................. 10-2004-0004212

(51) Int. Cl.
*H01L 21/31* (2006.01)
(52) U.S. Cl. ............... 438/784; 438/785; 438/787; 438/791
(58) Field of Classification Search ........ 438/778, 438/784, 785, 787, 791
See application file for complete search history.

(56) References Cited

U.S. PATENT DOCUMENTS

| 6,391,785 | B1 | 5/2002 | Satta et al. |
| 6,620,670 | B2 | 9/2003 | Song et al. |
| 7,007,933 | B2* | 3/2006 | Lee et al. ............... 261/121.1 |
| 2003/0003635 | A1 | 1/2003 | Paranjpe et al. |
| 2005/0012975 | A1* | 1/2005 | George et al. ............ 359/223 |

* cited by examiner

*Primary Examiner*—Hsien-Ming Lee
(74) *Attorney, Agent, or Firm*—F. Chau & Assoc., LLC

(57) ABSTRACT

Methods and apparatus are provided for forming thin films for semiconductor devices, which enable supplying and removing reactants containing constituent elements of a thin film to be formed, by preheating and supplying a process gas and a purging gas at a predetermined temperature in forming the thin film on a substrate. For example, a method for forming a thin film includes supplying a first reactant to a chamber to chemically adsorb the first reactant onto a substrate, the first reactant being bubbled by a first gas that is preheated, purging the chamber to remove residues on the substrate having the first reactant chemically adsorbed, and forming the thin film by a means of chemical displacement by supplying a second reactant to the chamber to chemically adsorb the second reactant onto the substrate.

27 Claims, 7 Drawing Sheets

METHODS AND APPARATUS FOR FORMING THIN FILMS FOR SEMICONDUCTOR DEVICES

CROSS-REFERENCE TO RELATED APPLICATION

This application claims priority to Korean Patent Application No. 2004-4212, filed Jan. 20, 2004, which is incorporated herein by reference in its entirety.

TECHNICAL FIELD OF THE INVENTION

The present invention relates, generally, to semiconductor fabrication and, more particularly, to methods and apparatus for forming thin films for semiconductor, devices using atomic layer deposition (ALD).

BACKGROUND

Generally, a thin film is used as, for example, a dielectric film of a semiconductor device, a transparent conductor of a liquid crystal display device, a protection layer of an electroluminescent thin film display, and the like. In particular, when the thin film is used as the dielectric film of the semiconductor device, it is required to have no impurity or defect in the dielectric film and at an interface of the dielectric film to secure high capacitance and suppress current leakage. Further, a thin film must have excellent step coverage and uniformity.

However, the use of a typical chemical vapor deposition (CVD) method, a typical physical vapor deposition (PVD) method, or the like in the formation of the thin film makes it difficult to achieve excellent step coverage. In the typical CVD method, a deposition process utilizing a surface kinetic mode allows the dielectric film having relatively excellent step coverage to be obtained, but since reactants needed to deposit the dielectric film are simultaneously delivered onto a substrate, it is difficult to adjust the step coverage at a specific portion on the substrate as necessary.

Recently, in order to overcome the aforementioned problem, thin film forming methods have been proposed in which reactants are periodically supplied onto the surface of a substrate on which a thin film is to be formed, activating a surface kinetic region, resulting in generally excellent step coverage. These methods include, for example, atomic layer deposition (ALD), cyclic chemical vapor deposition (cyclic CVD), digital chemical vapor deposition (Digital CVD), and advanced chemical vapor deposition (advanced CVD).

Further, in order to introduce a thin film material, which has an excellent property in a bulk state, there is a need for a thin film forming technique capable of allowing the material to maintain its excellent property even after the thin film has been formed. However, in the case where the thin film is fabricated using the foregoing methods, unnecessary atoms contained in a chemical ligand constituting reactants remain in the thin film, and become impurities or particles on the surface of the substrate. The residues produced in the thin film forming process significantly affect the control of the impurities or particles in the thin film.

In the above-mentioned thin film forming techniques, necessary atoms, as the thin film material are delivered in a high vapor pressure state onto the substrate having the thin film formed. For this reason, even reactants such as metal organic precursors, metal halides, or the like may be delivered in a vapor state onto the substrate, in addition to the normally necessary elements. To minimize the impurities in the thin film that is desired to be formed, metal atoms and organic ligands or halides among the reactants, which are delivered onto the substrate as described above, are removed by decomposition in the chemical vapor deposition (CVD) method while they are removed by chemical displacement in the atomic layer deposition (ALD) method. That is, in the atomic layer deposition (ALD) method, necessary source gases are not mixed in a reaction chamber but are flowed into the chamber in a pulse manner one by one. For example, when a thin film consisting of an atomic layer is formed using first and second reactants, the thin film is formed by a method in which only the first reactant flows in a reaction chamber so that a first reaction gas is chemically adsorbed on a substrate, and then the second reactant is supplied to the reaction chamber so that the second reactant is chemically adsorbed on the substrate. Such a thin film forming method using the atomic layer deposition is disclosed in U.S. Pat. No. 6,620,670 entitled "PROCESS CONDITIONS AND PRECURSORS FOR ATOMIC LAYER DEPOSITION (ALD) OF $Al_2O_3$."

FIGS. 1 to 4 illustrate a conventional method for forming a thin film on a substrate using atomic layer deposition.

First, as shown in FIG. 1, a first reactant of a compound, AXn(g), is supplied onto a semiconductor substrate 10 loaded in a chamber 12, wherein A denotes a first material constituting a thin film to be deposited, and Xn denotes a material chemically combined with the material A. The first reactant of the AXn is bubbled and supplied in a gas state to the chamber 12 via a gas line. The first supplied reactant of the AXn is chemically adsorbed to the surface of the semiconductor substrate 10.

Subsequently, as shown in FIG. 2, a purging or pumping process is conducted in the chamber to leave only the AXn(s), which has been chemically adsorbed on the semiconductor substrate. Accordingly, residues, which float in the chamber 12 or are physically adsorbed on the semiconductor substrate 10, are drained away from the chamber 12.

Next, as shown in FIG. 3, a second reactant of a compound, BYn(g), is supplied into the chamber 12, wherein B denotes a second material constituting the thin film to be deposited, and Yn denotes a material chemically combined with the material B. The second reactant of the BYn is bubbled and supplied in a gas state into the chamber 12 via a separate gas line. The second supplied reactant of the BYn is chemically adsorbed to the semiconductor substrate 10, such that the thin film of AB(s) is formed by chemical displacement.

Subsequently, as shown in FIG. 4, the purging or pumping process is conducted in the chamber to leave only the thin film of the AB(s), which has been formed on the semiconductor substrate. The residues, which float in the chamber 12 or are physically adsorbed, are drained away from the chamber. Accordingly, a single layer of the chemically adsorbed thin film, namely, a single layer of the AB(s) is formed on the semiconductor substrate 10. The processes of FIGS. 1 to 4 are repeated as one cycle a plurality of times until the thin film is formed in a desired thickness.

As described above, if the bubbled reactant is supplied, the property of the formed film varies as vapor pressure of the reactant and, therefore, the reactant must be heated for sufficient supply of the reactant. In particular, if the thin film is formed of a high dielectric material having very low vapor pressure, for example, $HfO_2$, $TiO_2$, $Ta_2O_5$, $ZrO_2$, $Nb_2O_5$, $CeO_2$, $In_2O_3$, $RuO_2$ or $IrO_2$, long-time heating is necessarily required. The long-time heating of the reactant makes it difficult to manage the reactant, and changes the reactant in quality. Further, it increases the supply time and removal time of the reactant, resulting in semiconductor yield reduction.

SUMMARY OF THE INVENTION

Exemplary embodiments of the invention generally include methods and apparatus for forming thin films for semiconductor devices, which enable the supply amount of a reactant to be increased by preheating and supplying a process gas used to bubble the reactant to a certain temperature so that a heating effect of the reactant is increased, in forming the thin film on a substrate. Exemplary methods and apparatus for forming thin films enable enhancement of a purging effect by heating and supplying a purging gas used to remove remaining residues in a chamber at a predetermined temperature in forming the thin film on a substrate.

Exemplary embodiments of the present invention also include methods and apparatus for forming thin films, which enable supply and removal of reactants containing constituent elements of a thin film to be formed by preheating and supplying a process gas and a purging gas at a predetermined temperature in forming the thin film on a substrate.

According to an exemplary embodiment of the present invention, a method for forming a thin film for a semiconductor device includes supplying a first reactant to a chamber to chemically adsorb the first reactant onto a substrate, the first reactant being bubbled by a first preheated and supplied gas, purging the chamber to remove residues on the substrate having the first reactant chemically adsorbed, and forming the thin film with chemical displacement by supplying a second reactant to the chamber to chemically adsorb the second reactant onto the substrate. The exemplary method may also include removing the residues on the substrate having the thin film by purging the chamber after forming the thin film.

Further, the first gas may be preheated by a heating means. The purging step may be performed by supplying to the chamber a purging gas preheated through the heating means. The second reactant supplied to the chamber may be bubbled and supplied by a second gas, the second gas being preheated through a heating means. The heating means may be a sheath heater, a tubular heater, a cartridge heater, a coil heater, a band heater, a jacket heater, or a ribbon heater.

According to another exemplary embodiment of the present invention, an apparatus for forming a thin film for a semiconductor device comprises a chamber into which a substrate is loaded, a first reactant supply unit for supplying a first reactant to the chamber, a first gas line for connecting between the chamber and the first reactant supply unit, a second reactant supply unit for supplying a second reactant to the chamber, a second gas line for connecting between the chamber and the second reactant supply unit, a gas supply unit for supplying a process gas to the chamber, the first reactant supply unit and the second reactant supply unit, a third gas line for connecting between the first reactant supply unit and the gas supply unit, the third gas line including a heating means for heating the process gas, a fourth gas line for connecting between the second reactant supply unit and the gas supply unit, and a fifth gas line for connecting between the chamber and the gas supply unit.

According to yet another exemplary embodiment of the present invention, an apparatus for forming a thin film for a semiconductor device on a substrate by means of chemical displacement by chemically adsorbing first and second bubbled reactants in sequence comprises a heating means for preheating a process gas that is supplied to bubble the first reactant. The apparatus may also comprise a heating means for preheating a purging gas, the purging gas being supplied to perform a purging process of removing remaining residues after the first reactant or the second reactant is chemically adsorbed. The apparatus may further comprise a heating means for preheating a process gas that is supplied to bubble the second reactant.

These and other exemplary embodiments, features, aspects, and advantages of the present invention will be described and become more apparent from the following detailed description of exemplary embodiments when read in conjunction with accompanying drawings.

DETAILED DESCRIPTION OF EXEMPLARY EMBODIMENTS

Figure 1:
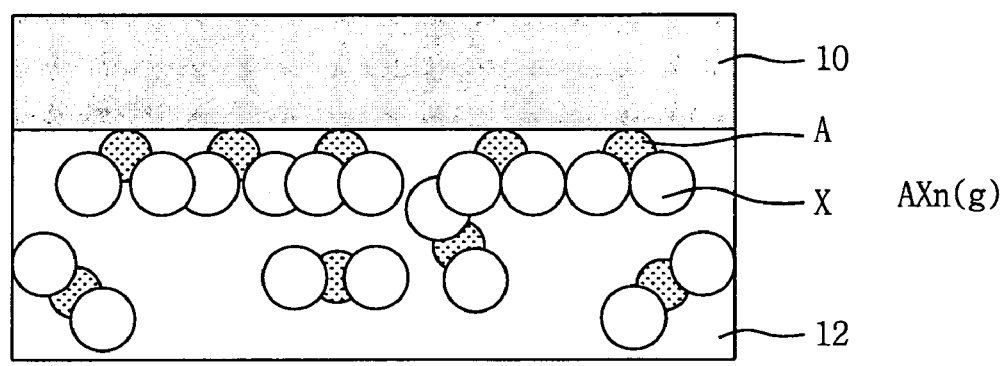
FIGS. 1 to 4 illustrate a conventional method for forming a thin film for a semiconductor device.
Figure 2:
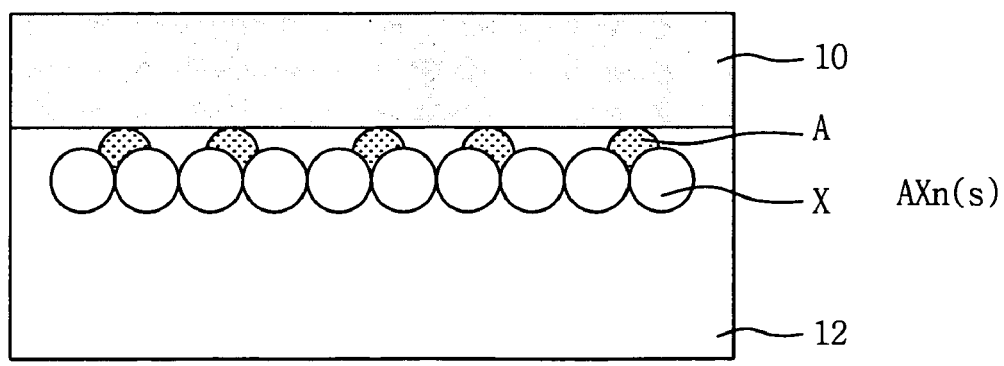
Figure 3:
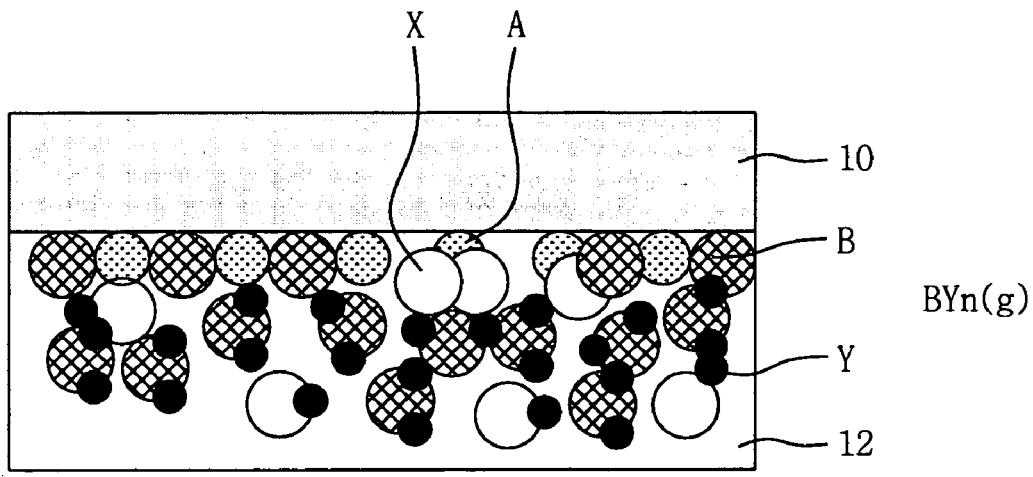
Figure 4:
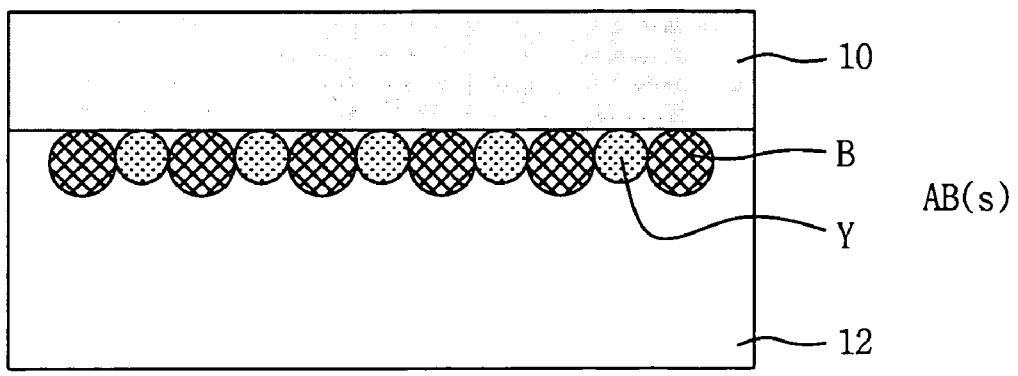
Figure 5:
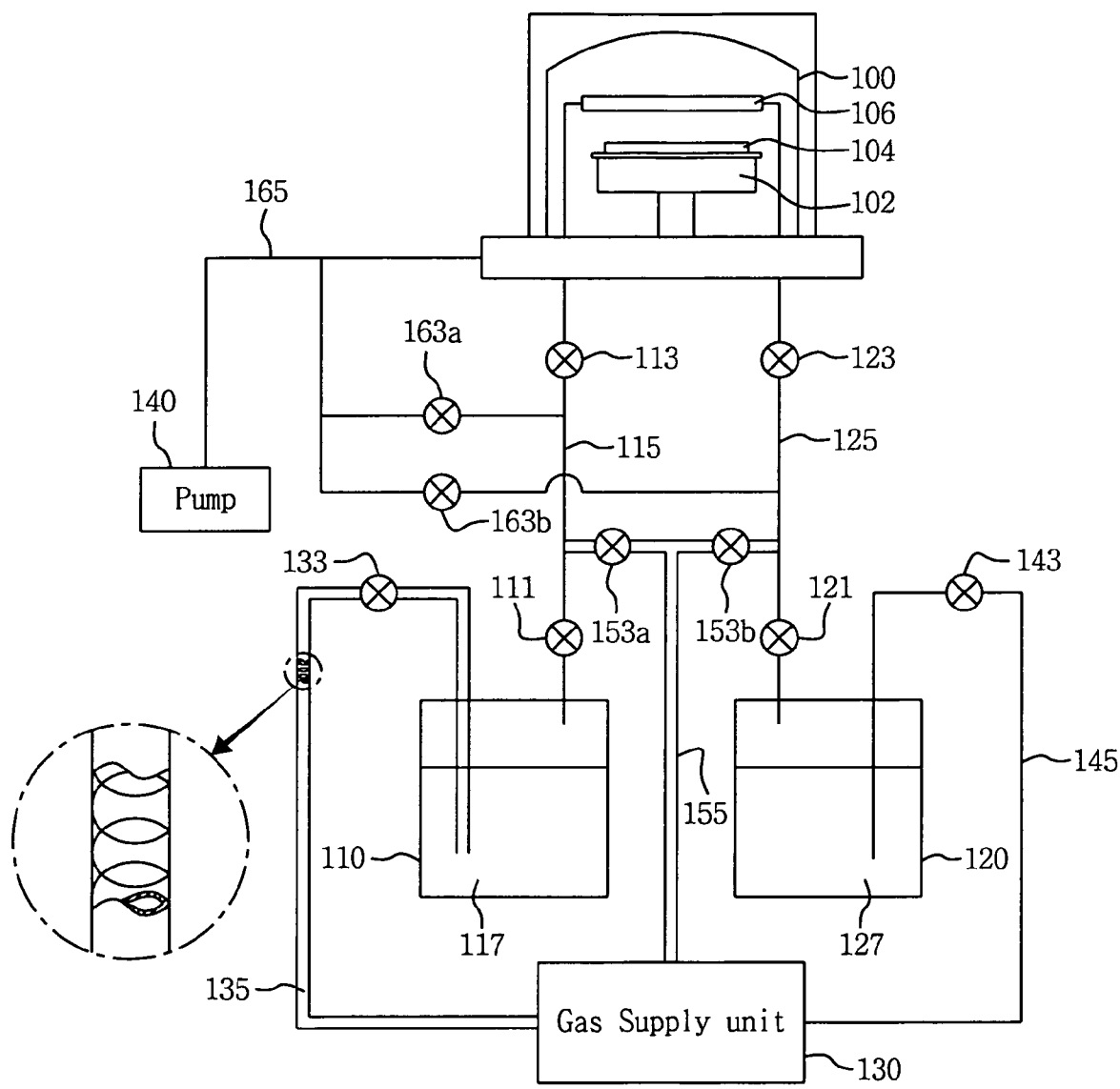
FIG. 5 schematically illustrates an apparatus for forming a thin film for a semiconductor device according to an exemplary embodiment of the present invention.

FIG. 5 schematically illustrates an apparatus for forming a thin film for a semiconductor device according to an exemplary embodiment of the present invention. The structure of a thin film forming apparatus, and a thin film forming method according to an exemplary embodiment of the present invention will be discussed with reference to FIG. 5.

First, the structure of the thin film forming apparatus according to an exemplary embodiment of the present invention will be described with reference to FIG. 5. The apparatus includes a chamber 100 into which a substrate is loaded, a first reactant supply unit 110 for supplying a first reactant to the chamber, a second reactant supply unit 120 for supplying a second reactant to the chamber, a gas supply unit 130 for supplying a process gas to the chamber 100, the first reactant supply unit 110 and the second reactant supply unit 120, and a pump 140 for performing a pumping operation to remove remaining residues in the chamber. The apparatus further includes a first gas line 115 for connecting between the chamber 100 and the first reactant supply unit 110, a second gas line 125 for connecting between the chamber 100 and the second reactant supply unit 120, a third gas line 135 for connecting between the first reactant supply unit 110, and the gas supply unit 130, a fourth gas line 145 connecting between the second reactant supply unit 120 and the gas supply unit 130, a fifth gas line 155 for connecting between the chamber 100 and the gas supply unit 130, and a sixth gas line 165 for connecting between the chamber 100 and the pump 140.

The gas supply unit 130 provides to the first reactant supply unit 110 a process gas, for example, an inert gas such as an argon gas (Ar), which is heated through the third gas line 135 connected to the first reactant supply unit. The third gas line 135 may be formed in a sufficient length to effectively heat the process gas. The third gas line 135 may be formed in a coil shape. The third gas line 135 also includes a heating means capable of heating the process gas. The heating means may be composed of a heater, for example, a sheath heater, a tubular heater, a cartridge heater, a band heater, or a jacket heater. Alternatively, the heating means may be formed of, for example, a coil or ribbon heater having a structure in which the sheath heater, the tubular heater, or the cartridge heater is wound around the third coiled gas line 135. The third gas line 135 may include a control valve 133 capable of controlling the process gas provided to the first reactant supply unit 110.

Further, the gas supply unit 130 provides to the chamber 100 a process gas, namely, a purging gas that is an inert gas such as an argon gas (Ar) or a nitrogen gas ($N_2$) through the fifth gas line 155 connected to the chamber so that a purging process for removing the residues in the chamber is performed. The fifth gas line 155 may heat the purging gas and then provide the heated purging gas to the chamber 100, similarly to the third gas line 135. In the case of heating the purging gas and then providing the heated purging gas to the chamber 100, the fifth gas line 155 may be formed in a sufficient length to effectively heat the purging gas. The fifth gas line 155 may be formed in a coil shape. The fifth gas line 155 may include a heating means. The heating means may be, for example, a sheath heater, a tubular heater, a cartridge heater, a band heater, or a jacket heater. Further, the heater may be, for example, a coil or ribbon heater having a structure in which the sheath heater, the tubular heater, or the cartridge heater is wound around the fifth coiled gas line 155. The fifth gas line 155 may include control valves 153a and 153b capable of controlling the purging gas, which is provided to the chamber 100.

The gas supply unit 130 also provides a process gas, for example, an inert gas such as an argon gas (Ar) to the second reactant supply unit 120 through the fourth gas line 145 connected to the second reactant supply unit. The fourth gas line 145 may heat the process gas and then provides the heated process gas to the second reactant supply unit 120, similarly to the third gas line 135. Further, the fourth gas line 145 may include a control valve 143 capable of controlling the process gas provided to the second reactant supply unit 120.

The first reactant supply unit 110 is provided with the preheated process gas through the third gas line 135 to convert a first reactant 117 from the liquid state to a bubble state, namely, a gas state and then provide a first reaction gas to the chamber 100 through the first gas line 115. The first reactant 117 varies depending on the type of the thin film, and contains a constituent element and a chemical ligand of the thin film to be formed. Further, as the first reaction gas, for example, Tetrakis Ethyl Methyl Amino Hafnium (TEMAH), $TiCl_4$, Tetrakis DiMethyl Amino Titanium (TDMAT), Tetrakis DiEthyl Amino Titanium (TDEAT), TriMethyl Aluminum (TMA), or TriEthyl Aluminum (TEA) may be provided. The first gas line 115 may include control valves 111 and 113 capable of controlling the first reaction gas and the purging gas provided to the chamber 100.

The second reactant supply unit 120 is provided with the process gas through the fourth gas line 145. The second reactant supply unit 120 converts a second reactant 127 from a liquid state to a bubble state, namely, a gas state, and then provides a second reaction gas to the chamber 100 through the second gas line 125. For the second reaction gas, $H_2O$, $H_2O_2$, $O_2$ or $O_3$ as an oxidizing agent may be provided, or $NH_3$, $N_2$, $O_2$ or $N_2O$ as a plasma gas for removing a hydroxyl group may be provided. The second gas line 125 may include control valves 121 and 123 capable of controlling the second reaction gas and the purging gas provided to the chamber 100.

The chamber 100 includes a heater 102 for maintaining temperature in the chamber, and a shower head 106 for injecting gases into the chamber. The heater 102 is operable to maintain temperature of the substrate 104 loaded in the chamber at about 150 to about 375° C. The shower head 106 is operable to inject the gases to be supplied to the chamber into the chamber for about 0.1 to about 10 secs.

The thin film forming method in accordance with an exemplary embodiment of the present invention will be now described. After the substrate 104 is loaded in the chamber, the substrate 104 is maintained at a predetermined temperature by the heater 102. Subsequently, the process gas, for example, the argon gas (Ar), which is heated to a predetermined temperature through the third gas line 135 including the heating means, is supplied to the first reactant supply unit to convert the first reactant 117 from a liquid state to a gas state. Thereafter, the control valves 111 and 113, which are mounted to the first gas line, are selectively operated to inject the first reaction gas into the chamber through the first gas line 115 and the shower head 106. As a result, the first reaction gas supplied into the chamber is chemically adsorbed onto the substrate 104 or is physically adsorbed to the first chemically adsorbed reactant.

The control valve 153a or 153b, which is mounted to the fifth gas line that connects between the chamber and the gas supply unit, is operated to supply to the chamber 100 a purging gas, for example, an argon gas (Ar) or a nitrogen gas ($N_2$) heated to a predetermined temperature through the fifth gas line 155 having the heating means. Accordingly, the residues, which float in the chamber or are physically adsorbed on the substrate, are removed from the chamber. To remove the residues, a pumping process using the pump 140 may be performed in place of the purging process.

Next, the process gas, for example, the argon gas (Ar) is supplied to the second reactant supply unit 120 through the fourth gas line 145 to convert the second reactant 127 from a liquid state to a gas state. Thereafter, the control valves 121 and 123 mounted to the second gas line are selectively operated to inject the second reaction gas into the chamber through the second gas line 125 and the shower head 106. As a result, the second reaction gas supplied to the chamber is chemically adsorbed onto the substrate or is physically adsorbed onto the first and second chemically adsorbed reactants. Further, the first and second chemically adsorbed reactants form a solid-state thin film on the substrate by means of chemical displacement. If the fourth gas line includes heating means, a heated process gas may be supplied to the second reactant supply unit.

The solid-state thin film may be formed of, for example, a single atomic thin film, a single atomic oxide, a complex oxide, a single atomic nitride film, or a complex nitride film. The single atomic thin film may be formed of, for example, Ti, Ta, Ru, Ir, Rh, Mo, Al, Cu, Pt, W or Ag, and the single atomic oxide may be formed of, for example; $HfO_2$, $TiO_2$, $Ta_2O_5$, $ZrO_2$, $Nb_2O_5$, $CeO_2$, $In_2O_3$, $RuO_2$, $IrO_2$ or $Al_2O_3$.

Further, the complex oxide may be formed of $SrTiO_3$, $PbTiO_3$, $SrRuO_3$, $CaRuO_3$, $(Ba, Sr)TiO_3$, $Pb(Zr,Ti)O_3$, $(Pb, La)(Zr,Ti)O_3$, $(Sr,Ca)RuO_3$, $In_2O_3$ doped with Sn, $In_2O_3$ doped with Fe, or $In_2O_3$ doped with Zr. The single atomic nitride film may be formed of TiN, TaN, NbN, ZrN, $Ya_3N_5$, SiN, AlN, GaN, WN or BN. The complex nitride film may be formed of TiSiN, TaSiN, AlTiN, WBN, WSiN or AlSiN.

Subsequently, the control valve 153a or 153b, which is mounted to the fifth gas line that connects the chamber and the gas supply unit, is operated to supply to the chamber 100 the purging gas, for example, the argon gas (Ar) or the nitrogen gas ($N_2$) heated to a predetermined temperature through the fifth gas line 155 having the heating means. Accordingly, the residues, which float in the chamber or are physically adsorbed on the substrate, are removed from the chamber. As a result, a single layer of the chemically adsorbed thin film is formed on the substrate. A pumping process using the pump 140 may be performed in place of the purging process to remove the residues.

Figure 6:
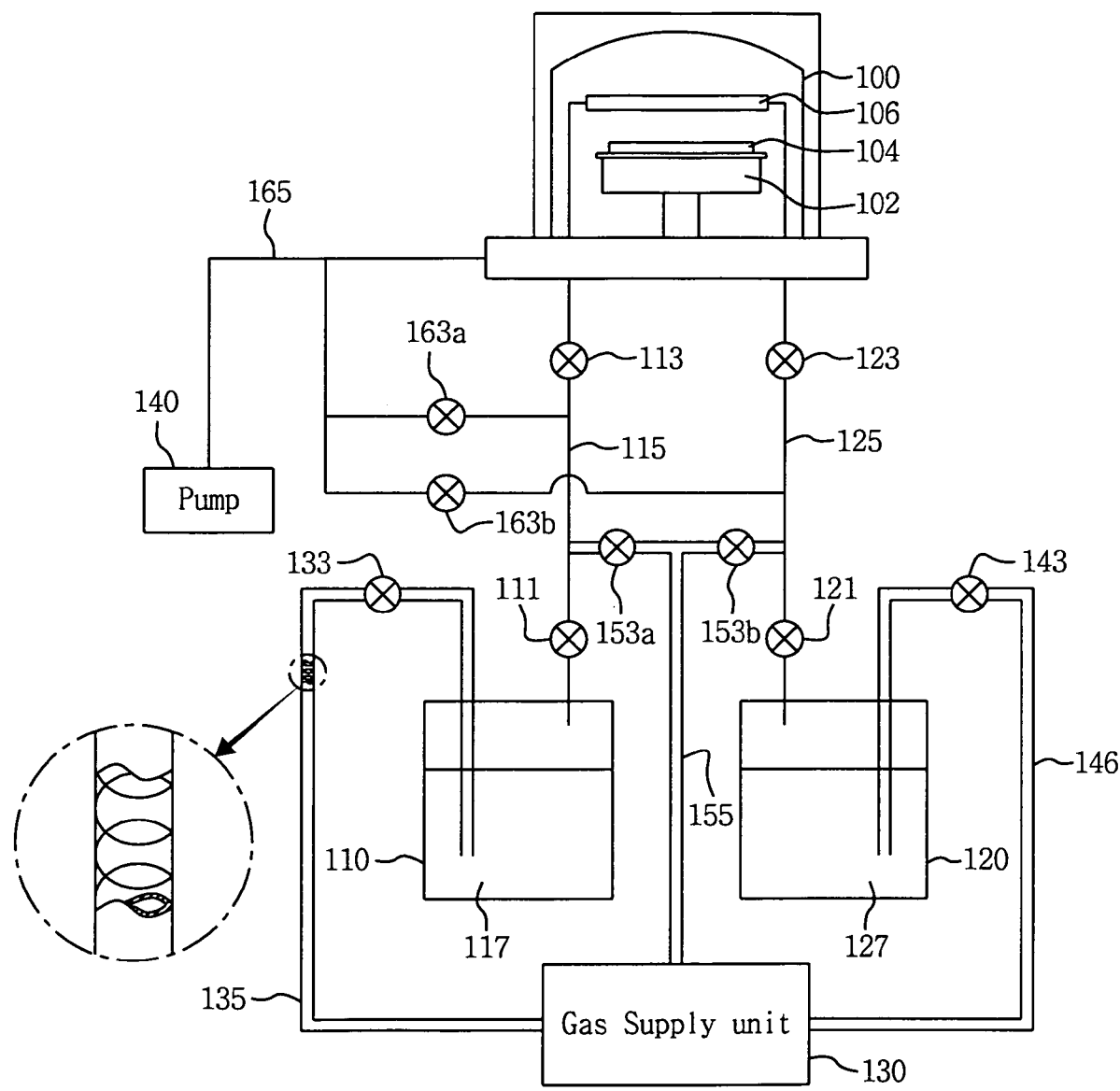
FIG. 6 schematically illustrates an apparatus for forming a thin film for a semiconductor device according to another exemplary embodiment of the present invention.

FIG. 6 schematically illustrates an apparatus for forming a thin film for a semiconductor device in accordance with another exemplary embodiment of the present invention. Here, the identical or similar portions to those of the thin film forming apparatus of FIG. 5 will be roughly described and it should not be construed as limiting the scope of the present invention.

Referring to FIG. 6, the apparatus for forming a thin film in accordance with another exemplary embodiment of the present invention includes a chamber 100 into which a substrate is loaded, a first reactant supply unit 110 for supplying a first reactant to the chamber, a second reactant supply unit 120 for supplying a second reactant to the chamber, a gas supply unit 130 for supplying a process gas to the chamber 100, the first reactant supply unit 110 and the second reactant supply unit 120, and a pump 140 for performing a pumping operation to remove remaining residues in the chamber. The apparatus further includes a first gas line 115 for connecting between the chamber 100 and the first reactant supply unit 110, a second gas line 125 for connecting between the chamber 100 and the second reactant supply unit 120, a third gas line 135 for connecting between the first reactant supply unit 110 and the gas supply unit 130, a fourth gas line 146 connecting between the second reactant supply unit 120 and the gas supply unit 130, a fifth gas line 155 for connecting between the chamber 100 and the gas supply unit 130, and a sixth gas line 165 for connecting between the chamber 100 and the pump 140.

The gas supply unit 130 provides to the first reactant supply unit 110 a process gas, for example, an inert gas such as an argon gas (Ar), which is heated through the third gas line 135 connected to the first reactant supply unit. The gas supply unit 130 also provides to the chamber 100 a process gas, namely, a purging gas such as the argon gas (Ar) or a nitrogen gas ($N_2$) through the fifth gas line 155 connected to the chamber so that a purging process for removing the residues in the chamber is performed. The gas supply unit 130 also provides a process gas to the second reactant supply unit 120. Preferably, the process gas is an inert gas, e.g., an argon gas (Ar). The process gas may be heated through the fourth gas line 146 connected to the second reactant supply unit.

The third, fourth and fifth gas lines 135, 146 and 155 may be formed in a sufficient length to effectively heat the process gas or the purging gas. The third, fourth and fifth gas lines 135, 146 and 155 may be formed in a coil shape. Further, the third, fourth and fifth gas lines 135, 146 and 155 include a heating means capable of heating the process gas or the purging gas. The heating means may be, for example, a sheath heater, a tubular heater, a cartridge heater, a band heater, or a jacket heater. Further, the heating means may be, for example, a coil or ribbon heater having a structure in which the sheath heater, the tubular heater, or the cartridge heater is wound around the third, fourth and fifth coiled gas lines 135, 146 and 155. The third, fourth and fifth gas lines 135, 146 and 155 may include control valves 133, 143, and 153a and 153b capable of controlling the process gas or the purging gas, respectively.

The first reactant supply unit 110 is provided with the preheated process gas through the third gas line 135 to convert a first reactant from a liquid state to a bubble state, namely, a gas state and then to provide a first reaction gas to the chamber 100 through the first gas line 115. The second reactant supply unit 120 is provided with the process gas through the fourth gas line 145 to convert a second reactant from a liquid state to a bubble state, namely, a gas state and then to provide a second reaction gas to the chamber 100 through the second gas line 125. The first gas line 115 may include control valves 111 and 113 and the second gas line 125 may include control valves 121 and 123 capable of controlling the reaction gas or the purging gas, which is provided to the chamber 100.

The chamber 100 includes a heater 102 for maintaining temperature in the chamber, and a shower head 106 for injecting gases into the chamber. The heater 102 is operable to maintain temperature of the substrate 104 loaded in the chamber at about 150 to about 375° C. The shower head 106 is operable to inject the gases to be supplied to the chamber into the chamber for about 0.1 to about 10 secs.

Figure 7:
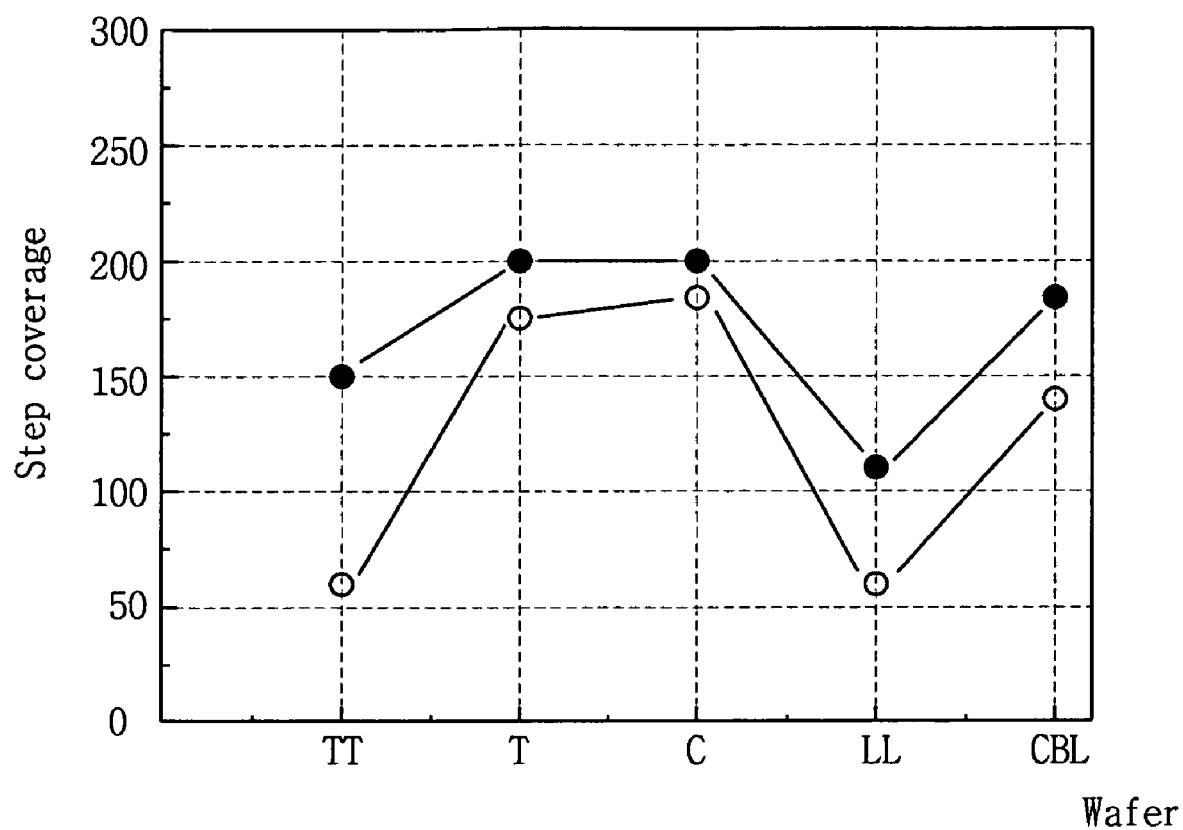
FIG. 7 is a graph showing step coverage of a thin film formed using thin film forming methods according to an exemplary embodiment of the present invention and according to the prior art.

FIG. 7 is a graph showing step coverage of a thin film formed using a thin film forming method in accordance with the present invention. It shows a result of an experiment in which a hafnium oxide ($HfO_2$) film is formed on a substrate, wherein the TEMAH, which is a liquid compound having the highest volatility among hafnium amide system compounds, is used as a source gas and an argon gas (Ar), heated to about 80° C., is used as a process gas. An abscissa axis of the graph indicates the position of a wafer and an ordinate axis indicates step coverage in a bottom portion at a relevant wafer position. In FIG. 7, TT indicates a top portion of the wafer, C indicates a center of the wafer, and LL indicates a side (leftmost side) of the wafer. T indicates an intermediate point between the top portion and the center of the wafer, and CBL indicates a 45° point moving from an intermediate point between the side and the center of the wafer to the bottom side.

From FIG. 7, it can be seen that bottom portion step coverage at the TT point is about 60 when a non-heated process gas is supplied to form the thin film in accordance with a prior art while the step coverage at the same point is improved and is about 150 when the process gas is heated to a predetermined temperature and is supplied to form the thin film in accordance with an exemplary embodiment of the present invention. Similarly, in a prior art the T, C, LL, and CBL points have step coverage of 178, 180, 60 and 140, respectively, while in an exemplary embodiment of the present invention, the TT, T, C, LL, and CBL points have step coverage of about 150, about 200, about 200, about 110, and about 180, respectively. It shows that the step coverage is significantly improved compared to the prior art, as well as deviation of the step coverage is significantly reduced.

Figure 8A:
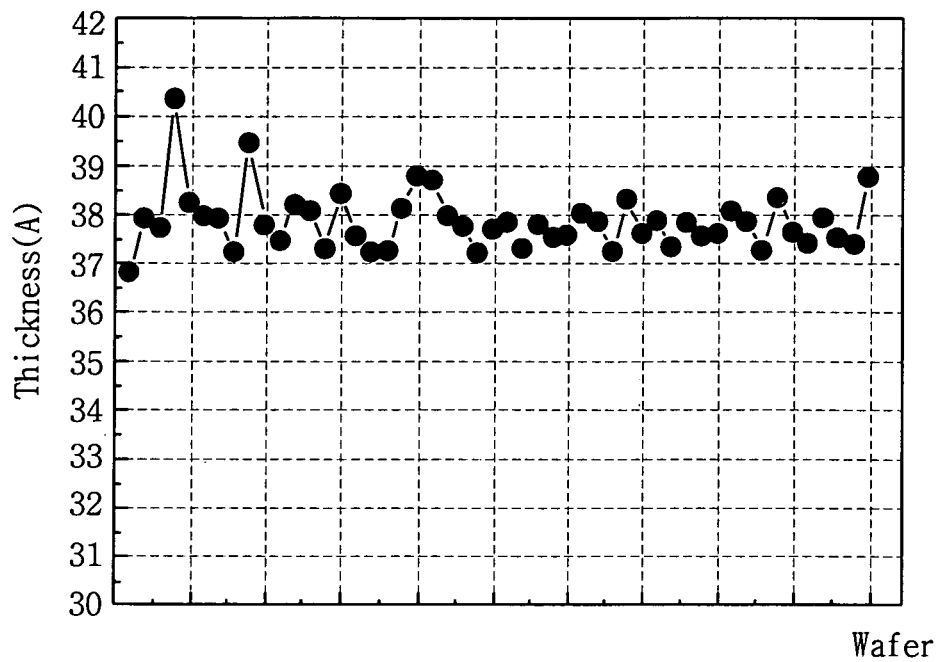
FIG. 8*a* is a graph showing the thickness of a thin film formed using a thin film forming method according to the prior art.
Figure 9A:
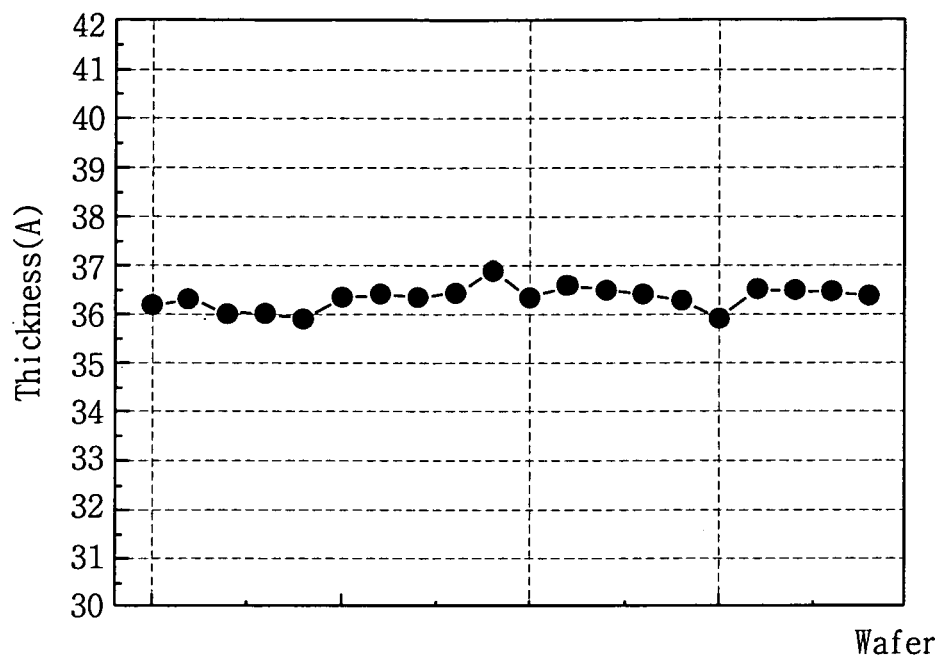
FIG. 9*a* is a graph showing the thickness of a thin film formed using a thin film forming method according to an exemplary embodiment of the present invention.

FIG. 8a is a graph showing the thickness of a thin film formed using the thin film forming method in accordance with the prior art, and FIG. 9a is a graph showing the thickness of a thin film formed using the thin film forming method in accordance with an exemplary embodiment of the present invention.

From FIGS. 8a and 9a, it can be seen that the thickness of the thin film formed using the thin film forming method in accordance with an exemplary embodiment of the present invention has much higher uniformity than that of the thin film formed using the thin film forming method in accordance with the prior art.

Figure 8B:
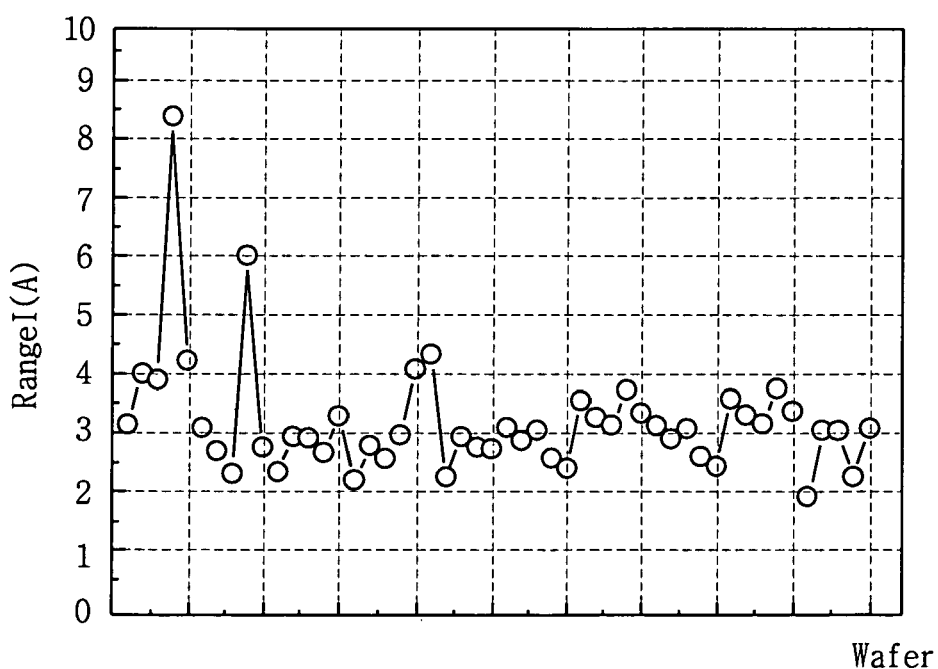
FIG. 8*b* is a graph showing the range of a thin film formed using a thin film forming method according to the prior art.
Figure 9B:
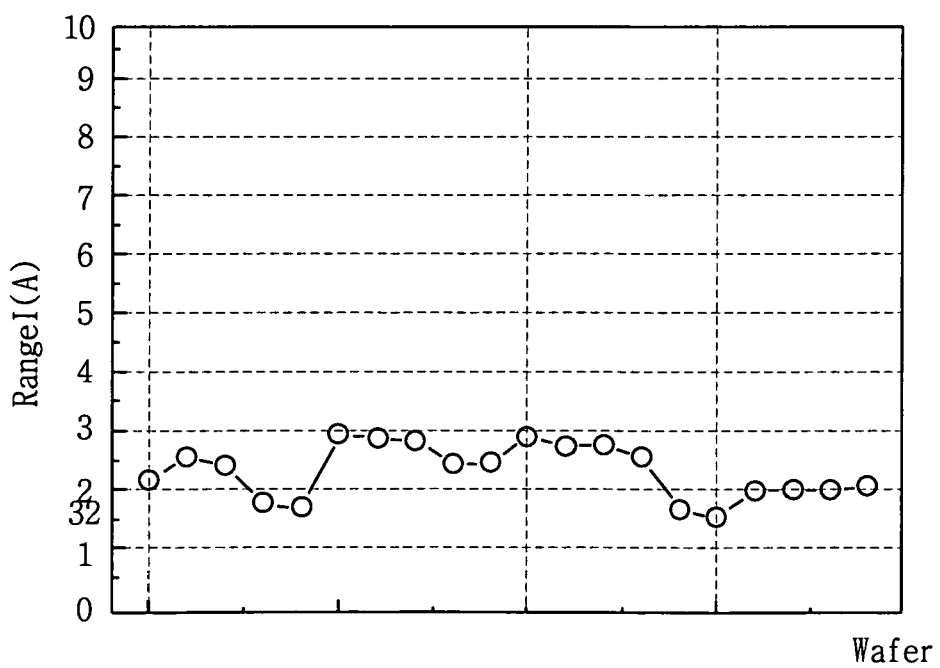
FIG. 9*b* is a graph showing the range of a thin film formed using a thin film forming method according to an exemplary embodiment of the present invention.

FIG. 8b is a graph showing the range of a thin film formed using a thin film forming method in accordance with a prior art, and FIG. 9b is a graph showing the range of a thin film formed using a thin film forming method in accordance with an exemplary embodiment of the present invention.

From FIGS. 8b and 9b, it can be seen that the thin film formed using the thin film forming method in accordance with an exemplary embodiment of the present invention has a much narrower range than that of the thin film formed using the thin film forming method in accordance with the prior art.

Thus, with the thin film forming method in accordance with an exemplary embodiment of the present invention, it is possible to increase the supply amount of the reactant by preheating and supplying the process gas used to bubble the reactant to a certain temperature so that the heating effect of the reactant is enhanced. In particular, it is possible to increase the supply amount of the reactant without long-time heating when the thin film is formed using a high dielectric material having very low vapor pressure. Further, it is possible to enhance the purging effect by heating and supplying the purging gas used to remove remaining residues in the chamber to a certain temperature. Accordingly, it is possible to supply and remove the reactants containing constituent elements of the thin film to be formed in forming the thin film on the substrate using the atomic layer deposition.

It will be apparent to those skilled in the art that the present invention is not limited to the exemplary methods and apparatus for forming thin films for semiconductor devices described herein, and that various designs and applications may be made to the present invention without departing from the basic principle of the present invention.

As described above, the present invention has an advantage that the supply amount of the reactant can be increased by preheating and supplying the process gas used to bubble the reactant to a certain temperature so that a heating effect of the reactant is enhanced, in forming the thin film on the substrate.

Further, the present invention has an advantage that the purging effect is enhanced by heating and supplying the purging gas used to remove remaining residues in the chamber to a certain temperature in forming the thin film on the substrate.

Further, the present invention has an advantage that reactants containing constituent elements of a thin film to be formed can be smoothly supplied and removed by preheating and supplying the process gas and the purging gas to a certain temperature in forming the thin film on the substrate.

The invention has been described using exemplary embodiments. However, it is to be understood that the scope of the invention is not limited to the disclosed exemplary embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

What is claimed is:

1. A method for forming a thin film for a semiconductor device, the method including steps of:
    supplying a first reactant to a chamber to chemically adsorb the first reactant onto a substrate, the first reactant being bubbled by a first gas that is preheated to form a first reaction gas that then is supplied to the chamber;
    purging the chamber to remove residues on the substrate having the first reactant chemically adsorbed; and
    forming the thin film by means of chemical displacement by supplying a second reactant to the chamber to chemically adsorb the second reactant onto the substrate, wherein the thin film comprises one of a single atomic thin film formed of Ti, Ta, Ru, Ir, Rh, Mo, Al, Cu, Pt, W or Ag, a single atomic oxide formed of $HfO_2$, $Ta_2O_5$, $ZrO_2$, $Nb_2O_5$, $CeO_2$, $In_2O_3$, $RuO_2$, $IrO_2$, or $Al_2O_3$, a complex oxide formed of $SrTiO_3$, $PbTiO_3$, $SrRuO_3$, $CaRuO_3$, $(Ba,Sr)TiO_3$, $Pb(Zr,Ti)O_3$, $(Pb,La)(Zr,Ti)O_3$, $(Sr,Ca)RuO_3$, $In_2O_3$, doped with Sn, $In_2O_3$ doped with Fe, or $In_2O_3$ doped with Zr, a single atomic nitride film formed of TiN, TaN, NbN, ZrN, $Ya_3N_5$, SiN, AlN, GaN, WN or BN, or a complex nitride film formed of TiSiN, TaSiN, AlTiN, WBN, WSiN or AlSiN.

2. The method according to claim 1, further including a step of:
    removing the residues on the substrate having the thin film by purging the chamber after forming the thin film.

3. The method according to claim 2, wherein a pumping step is performed in place of the purging step to remove the residues.

4. The method according to claim 1, wherein the first gas is preheated by a heating means and then is supplied to the chamber.

5. The method according to claim 4, wherein the heating means is a sheath heater, a tubular heater, a cartridge heater, a coil heater, a band heater, a jacket heater, or a ribbon heater.

6. The method according to claim 1, wherein the purging step is performed by supplying to the chamber a purging gas preheated through a heating means.

7. The method according to claim 6, wherein the purging gas is an inert gas.

8. The method according to claim 1, wherein the second reactant supplied to the chamber is bubbled by a second gas and then is supplied, the second gas being preheated through a heating means.

9. The method according to claim 8, wherein the heating means is a sheath heater, a tubular heater, a cartridge heater, a coil heater, a band heater, a jacket heater, or a ribbon heater.

10. The method according to claim 8, wherein the second gas is an inert gas.

11. The method according to claim 1, wherein the first gas is an inert gas.

12. The method according to claim 1, wherein the first reactant and the second reactant contain an element and a chemical ligand, respectively, the element and the chemical ligand constituting the thin film.

13. The method according to claim 1, wherein the thin film formed is the single atomic thin film.

14. The method according to claim 1, wherein the thin film formed is the single atomic oxide.

15. The method according to claim 1, wherein the thin film formed is the complex oxide.

16. The method according to claim 1, wherein the thin film formed is the single atomic nitride film.

17. The method according to claim 1, wherein the thin film formed is the complex nitride film.

18. The method according to claim 1, wherein a pumping step is performed in place of the purging step to remove the residues.

19. A method for forming a thin film for a semiconductor device, the method including steps of:
supplying a first reactant to a chamber to chemically adsorb the first reactant onto a substrate, the first reactant being bubbled by a first gas that is preheated;
purging the chamber to remove residues on the substrate having the first reactant chemically adsorbed, wherein the purging step is performed by supplying to the chamber a purging gas preheated through a heating means; and
forming the thin film by means of chemical displacement by supplying a second reactant to the chamber to chemically adsorb the second reactant onto the substrate, wherein the thin film comprises one of a single atomic thin film formed of Ti, Ta, Ru, Ir, Rh, Mo, Al, Cu, Pt, W or Ag, a single atomic oxide formed of $HfO_2$, $Ta_2O_5$, $ZrO_2$, $Nb_2O_5$, $CeO_2$, $In_2O_3$, $RuO_2$, $IrO_2$ or $Al_2O_3$, a complex oxide formed of $SrTiO_3$, $PbTiO_3$, $SrRuO_3$, $CaRuO_3$, $(Ba,Sr)TiO_3$, $Pb(Zr,Ti)O_3$, $(Pb,La)(Zr,Ti)O_3$, $(Sr,Ca)RuO_3$, $In_2O_3$, doped with Sn, $In_2O_3$ doped with Fe, or $In_2O_3$ doped with Zr, a single atomic nitride film formed of TiN, TaN, NbN, ZrN, $Ya_3N_5$, SiN, AlN, GaN, WN or BN, or a complex nitride film formed of TiSiN, TaSiN, AlTiN, WBN, WSiN or AlSiN.

20. The method according to claim 19, wherein the first gas is preheated by a heating means and then is supplied to the chamber.

21. The method according to claim 19, wherein the second reactant supplied to the chamber is bubbled by a second gas and then is supplied, the second gas being preheated through a heating means.

22. The method of claim 19, wherein the heating means for the purging gas is a sheath heater, a tubular heater, a cartridge heater, a coil heater, a band heater, a jacket heater, or a ribbon heater.

23. The method according to claim 19, wherein the thin film formed is the single atomic thin film.

24. The method according to claim 19, wherein the thin film formed is the single atomic oxide.

25. The method according to claim 19, wherein the thin film formed is the complex oxide.

26. The method according to claim 19, wherein the thin film formed is the single atomic nitride film.

27. The method according to claim 19, wherein the thin film formed is the complex nitride film.

* * * * *